United States Patent
Kim

(10) Patent No.: US 11,175,103 B2
(45) Date of Patent: Nov. 16, 2021

(54) HEAT SINK WITH DASHED CROSSHATCHED FIN PATTERN

(71) Applicant: Toshiba Memory Corporation, Tokyo (JP)

(72) Inventor: Dokyun Kim, San Jose, CA (US)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/570,846

(22) Filed: Sep. 13, 2019

(65) Prior Publication Data

US 2021/0080199 A1    Mar. 18, 2021

(51) Int. Cl.
F28F 7/00    (2006.01)
F28F 13/06    (2006.01)
F28F 9/00    (2006.01)

(52) U.S. Cl.
CPC .............. *F28F 13/06* (2013.01); *F28F 9/005* (2013.01); *F28F 2215/10* (2013.01)

(58) Field of Classification Search
CPC ......... F28F 13/06; F28F 9/005; F28F 2215/10
USPC ........................................................ 165/80.3
See application file for complete search history.

(56) References Cited

U.S. PATENT DOCUMENTS

| | | | | |
|---|---|---|---|---|
| 4,226,281 A | * | 10/1980 | Chu | H01L 23/4338 165/185 |
| 4,900,377 A | * | 2/1990 | Redford | B32B 38/06 156/62.2 |
| 4,961,930 A | * | 10/1990 | Perdelwitz, Jr. | A01K 1/0353 119/28.5 |
| 6,729,383 B1 | * | 5/2004 | Cannell | F28F 3/022 165/185 |
| 6,809,802 B1 | * | 10/2004 | Tsukamoto | G03F 7/707 355/53 |
| 7,532,475 B2 | * | 5/2009 | Michel | H01L 23/3733 165/185 |
| 8,794,011 B2 | * | 8/2014 | Phillips | G03F 7/70875 62/3.2 |
| 9,599,410 B2 | * | 3/2017 | Antel, Jr. | F02C 3/04 |
| 10,247,489 B2 | * | 4/2019 | Ahbel | F28D 9/0087 |
| 2002/0038703 A1 | * | 4/2002 | Maeda | F23K 5/22 165/168 |
| 2004/0079518 A1 | * | 4/2004 | del Puerto | G03F 7/70716 165/58 |
| 2009/0116195 A1 | * | 5/2009 | Yang | H01L 23/3675 361/709 |
| 2009/0145581 A1 | * | 6/2009 | Hoffman | H01L 23/473 165/80.3 |
| 2009/0147480 A1 | * | 6/2009 | Lee | H01L 23/4093 361/719 |
| 2009/0310310 A1 | * | 12/2009 | Anzai | H01L 23/467 361/704 |
| 2009/0314465 A1 | * | 12/2009 | Zheng | H01L 23/467 165/80.3 |
| 2009/0321050 A1 | * | 12/2009 | Guo | F28D 15/0275 165/80.3 |

(Continued)

*Primary Examiner* — Claire E Rojohn, III
(74) *Attorney, Agent, or Firm* — Foley & Lardner LLP

(57) ABSTRACT

Various implementations described herein relate to a heat sink having a base and a plurality of fins extending from the base. Each of the plurality of fins is spaced apart from other ones of the plurality of fins. The plurality of fins includes first fins and second fins. Each of the first fins is perpendicular to any of the second fins.

20 Claims, 6 Drawing Sheets

(56) References Cited

U.S. PATENT DOCUMENTS

| | | | |
|---|---|---|---|
| 2010/0065248 A1* | 3/2010 | Liu | F28F 3/02 165/80.3 |
| 2010/0065249 A1* | 3/2010 | Liu | F28D 15/0266 165/80.3 |
| 2010/0091495 A1* | 4/2010 | Patrick | F21V 29/763 362/249.02 |
| 2010/0157522 A1* | 6/2010 | Refai-Ahmed | G06F 1/20 361/679.54 |
| 2010/0157541 A1* | 6/2010 | Zhu | F28F 3/02 361/710 |
| 2011/0013402 A1* | 1/2011 | Little, Jr. | F21V 15/01 362/311.01 |
| 2014/0332182 A1* | 11/2014 | Taras | H01L 23/3677 165/80.3 |
| 2015/0219405 A1* | 8/2015 | Karavadi | B23P 15/26 165/181 |
| 2015/0245533 A1* | 8/2015 | Wright | H05K 1/0254 361/56 |
| 2015/0247686 A1* | 9/2015 | Akalanne | H05K 7/2019 165/84 |
| 2016/0081225 A1* | 3/2016 | Taketomi | F28D 15/0275 165/80.3 |
| 2017/0092565 A1* | 3/2017 | Chen | H01L 23/473 |
| 2017/0370776 A1* | 12/2017 | Kangas | G01J 5/0225 |
| 2020/0118905 A1* | 4/2020 | Chen | F28F 13/06 |
| 2020/0187392 A1* | 6/2020 | Joshi | H01L 23/4735 |
| 2020/0265178 A1* | 8/2020 | Hodes | H05K 7/20281 |

* cited by examiner

HEAT SINK WITH DASHED CROSSHATCHED FIN PATTERN

TECHNICAL FIELD

The present disclosure generally relates to a heat sink, and more particularly, to a design for fins of a heat sink.

BACKGROUND

Electronic devices (e.g., an electronic storage device such as a solid state drive) are provided with heat sinks to reduce temperature of electronic components by inducing heat dissipation. For example, a unidirectional heat sink uses air flowing from one direction toward the heat sink to dissipate heat, while a bidirectional heat sink uses air flowing from two directions toward the heat sink to dissipate heat. An omnidirectional heat sink uses air flowing from any direction toward the heat sink to dissipate heat. In unidirectional, bidirectional, and omnidirectional heat sinks, air flowing through pins (e.g., posts with a circular or oval cross section) or fins (flat rectangular cuboids) of the heat sinks is used to dissipate heat. In order to provide larger air channels for airflow, pins or fins in traditional heat sinks have small surface areas. In addition, with respect to the pin design, the curvature of surfaces of the pins reduce heat dissipation rates along directions in which airflow is leaner.

SUMMARY

In certain aspects, the present disclosure relates to implementations of a heat sink that includes a base having a reference line and a plurality of fins extending from the base. The plurality of fins includes first fins and second fins. Each of the first fins is at an X° angle relative to the reference line. Each of the second fins is at a −X° angle relative to the reference line. In some examples, X° is 45°, and −X° is −45°.

In certain aspects, the present disclosure relates to implementations of a heat sink that includes a base and a plurality of fins extending from the base. Each of the plurality of fins is spaced apart from other ones of the plurality of fins. The plurality of fins includes first fins and second fins. Each of the first fins is perpendicular to any of the second fins. Each of the second fins is perpendicular to any of the first fins.

In certain aspects, the present disclosure relates to implementations of a heat sink configuration that includes a first heat sink and a second heat sink. The first heat sink includes a first base having a first surface facing a first direction and a plurality of first heat sink fins extending from the first surface in the first direction. Each of the plurality of first heat sink fins is spaced apart from other ones of the plurality of first heat sink fins. The plurality of first heat sink fins form a first dashed crosshatch pattern. The second heat sink includes a second base having a second surface facing a second direction. The first direction is opposite to the second direction. The second heat sink includes a plurality of second heat sink fins extending from the second surface in the second direction. Each of the plurality of second heat sink fins is spaced apart from other ones of the plurality of second heat sink fins. The plurality of second heat sink fins forms a second dashed crosshatch pattern.

DETAILED DESCRIPTION

Among other aspects, the present disclosure relates to a heat sink with a dashed crosshatched fin pattern. In particular, the heat sink includes a base on which a plurality of fins are arranged. The plurality of fins, while all connected to the base, are separate from each other. As the fins are separate from each other, spaces or gaps are formed between the fins. Such spaces and gaps form air channels through which air can flow.

The fins include a plurality of first fins and a plurality of second fins. Each of the first fins is parallel to and/or aligned with (on a same line or plane as) the other first fins but not any of the second fins. Each of the second fins is parallel to and/or aligned with (on a same line or plane as) the other second fins but not any of the first fins. The first fins are arranged in a first orientation that is at an X° angle relative to a reference line or lines parallel thereto. The second fins are arranged in a second orientation that is at an −X° angle relative to the reference line or lines parallel thereto. In some examples, X° is 45°, and −X° is −45°. Groups of the first fins form lines resembling dashed lines when viewed perpendicularly. The plurality of first fins resembles a set of parallel dashed lines, each line being offset from the next. In some examples, the offset is such that the fins of alternate lines of first fins align. Groups of the second fins form lines that are perpendicular to the lines formed by the first fins and resemble dashed lines when viewed perpendicularly. The plurality of second fins resembles a set of parallel dashed lines, each line being offset from the next. In some examples, the offset is such that the fins of alternate lines of second fins align.

The orientations of the fins (e.g., the first orientation of the first fins and the second orientation of the second fins) and the separation of the fins form a two dimensional array resembling a dashed crosshatched fin pattern. The heat sink with the dashed crosshatched fin pattern is an omnidirectional heat sink, meaning that air from any and all directions relative to the heat sink can flow through the air channels formed by the fins for heat dissipation. Changes to the airflow has minimal or no impact to the heat dissipation characteristics or capabilities of the heat sink.

Figure 1:
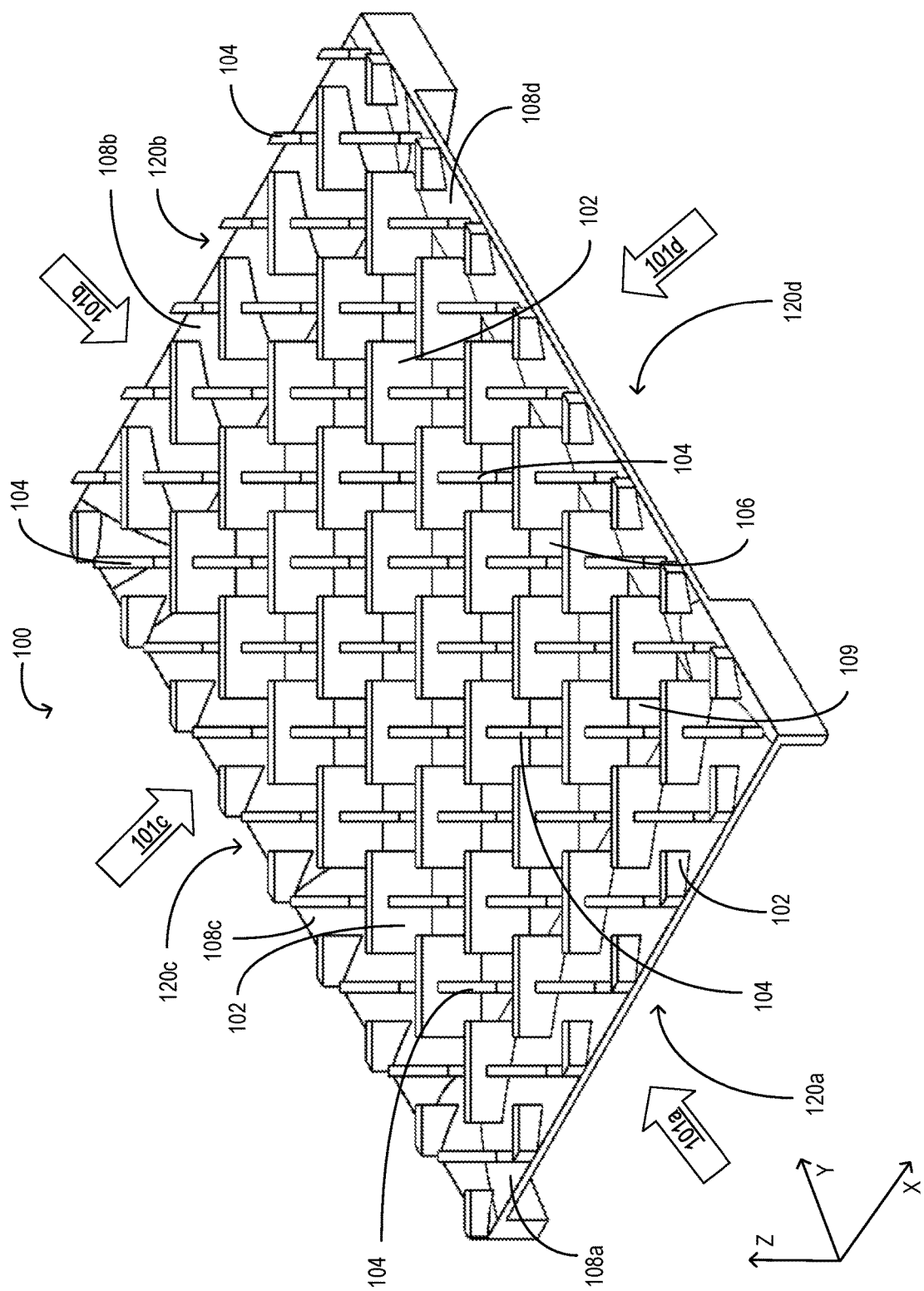
FIG. 1 is a perspective view of a heat sink, according to some implementations.
Figure 2:
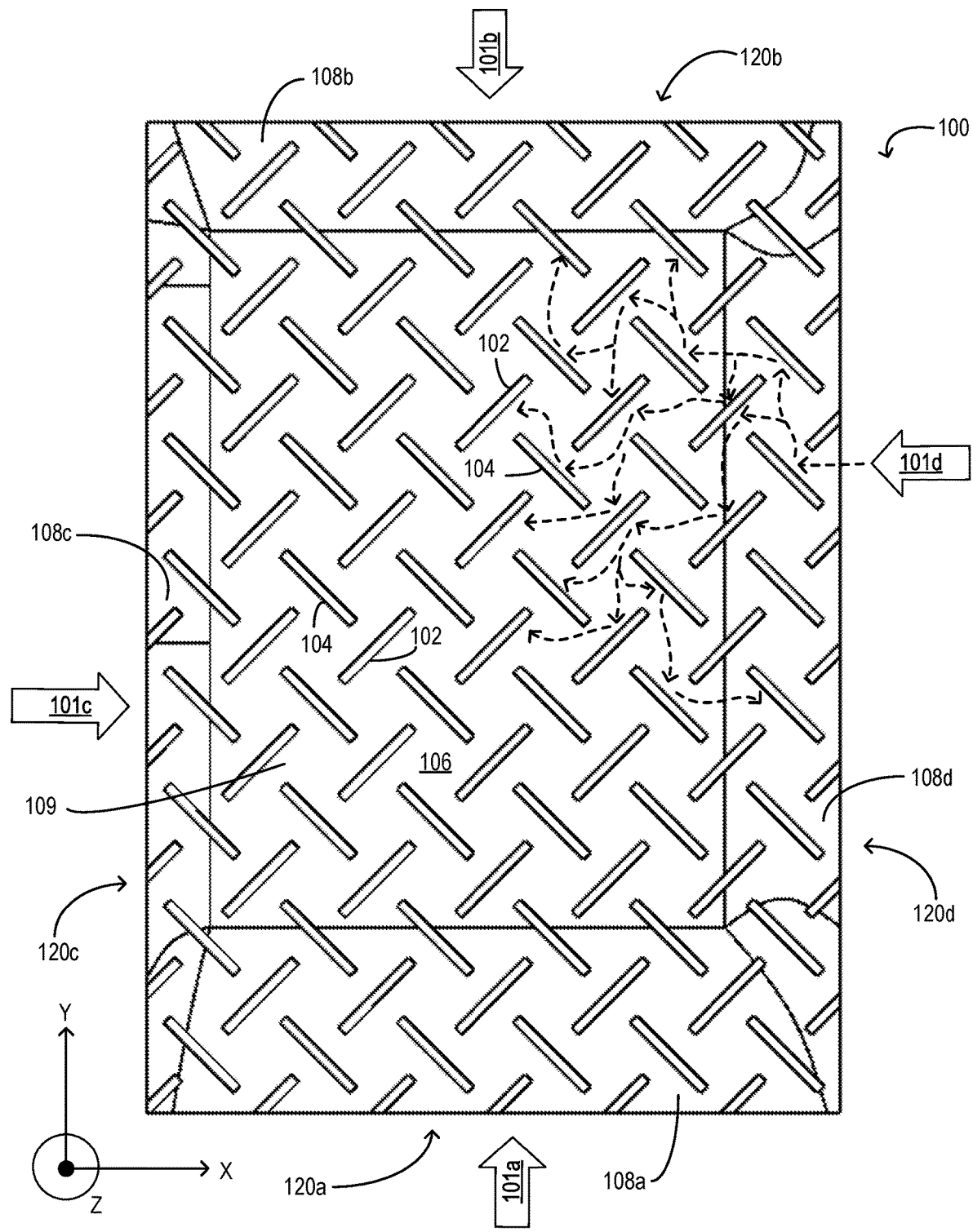
FIG. 2 is a top view of a heat sink, according to some implementations.
Figure 3:
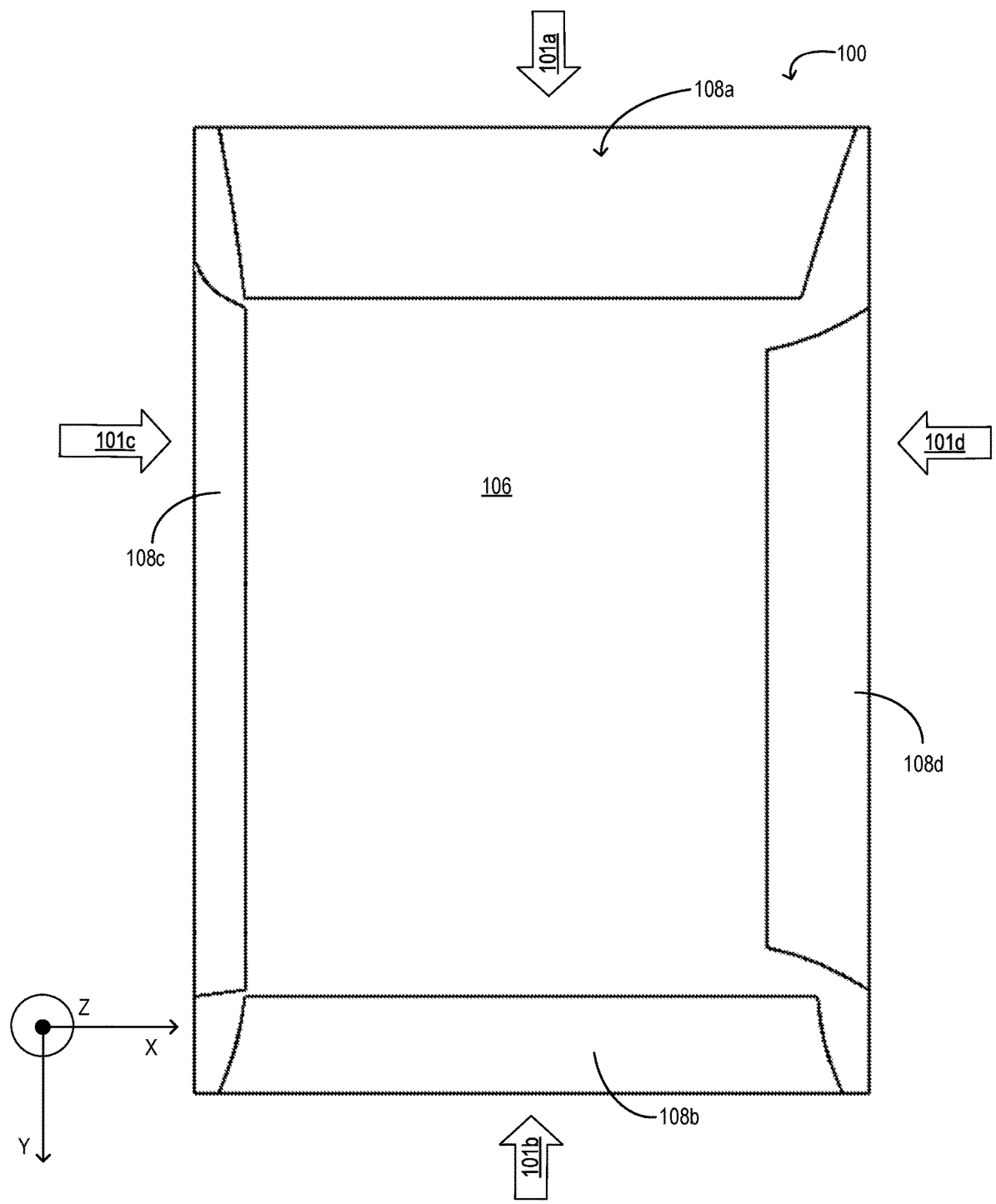
FIG. 3 is a bottom view of a heat sink, according to some implementations.
Figure 4:
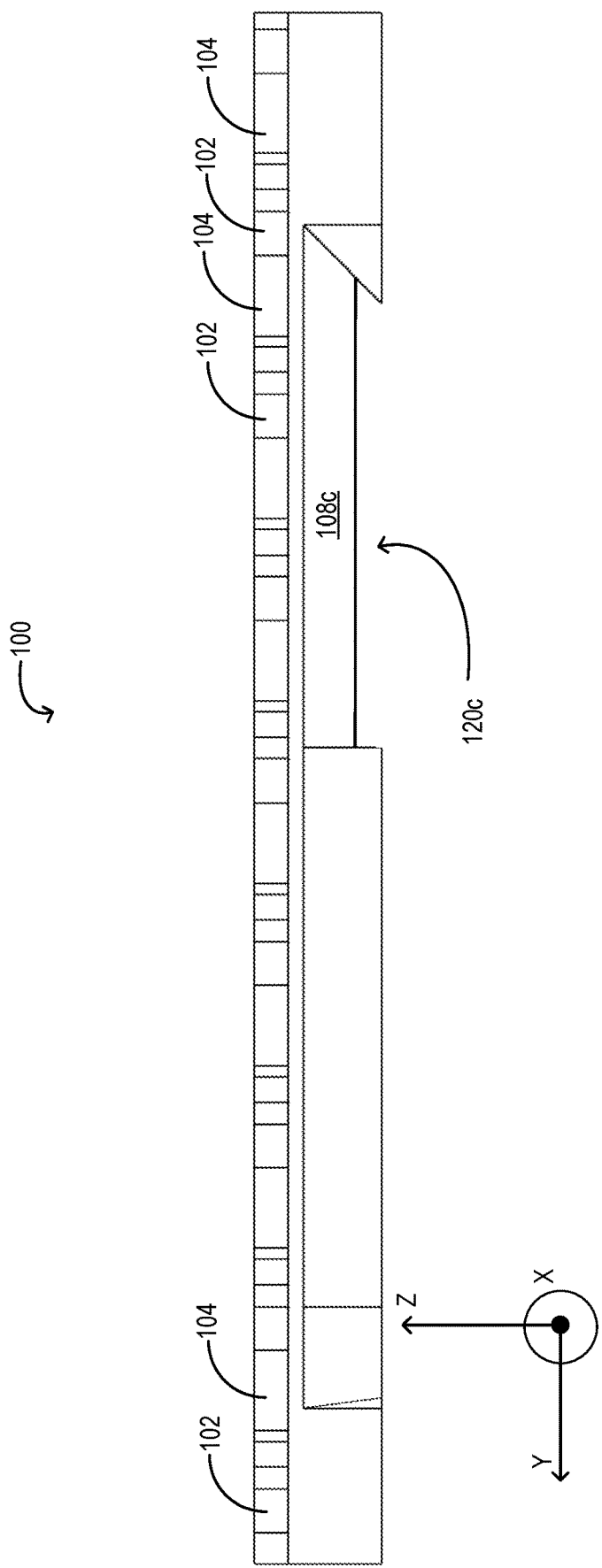
FIG. 4 is a side view of a heat sink, according to some implementations.
Figure 5:
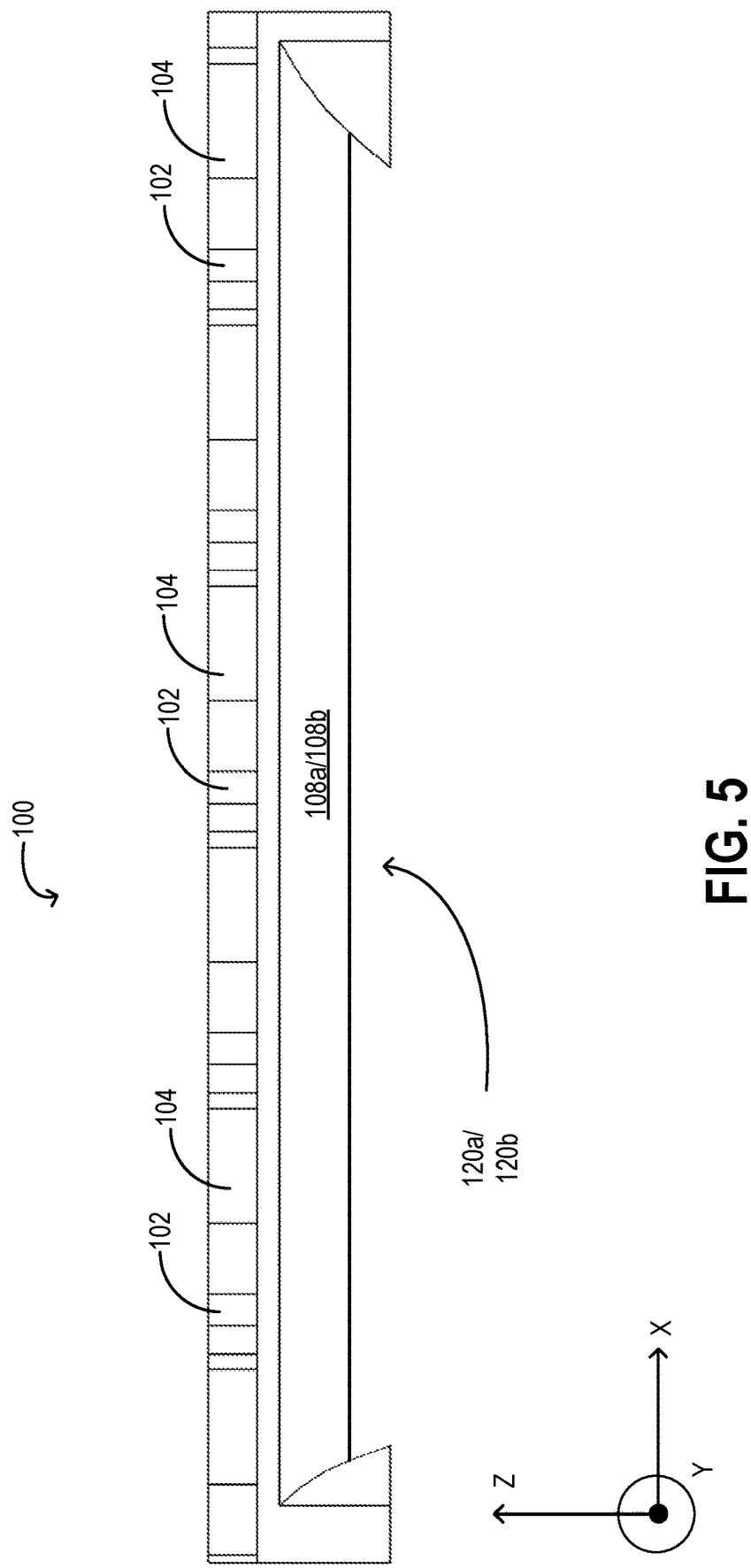
FIG. 5 is a front or back view of a heat sink, according to some implementations.

FIG. 1 is a perspective view of a heat sink 100, according to some implementations. FIG. 2 is a top view of the heat sink 100, according to some implementations. FIG. 3 is a bottom view of the heat sink 100, according to some implementations. FIG. 4 is a side view of the heat sink 100, according to some implementations. FIG. 5 is a front or back view of the heat sink 100, according to some implementations. Referring to FIGS. 1-5, the heat sink 100 is made from a metal material (e.g., aluminum, copper, and so on) or a metal alloy material (e.g., an aluminum alloy, a copper alloy, and so on), diamonds, or another material with high thermal conductivity.

The heat sink 100 includes a base 106 and fins (e.g., first fins 102 and second fins 104). The base 106 includes edge portions 108a-108d and a center portion 109 surrounded by the edge portions 108a-108d.

As shown, the fins (e.g., the first fins 102 and the second fins 104) are raised protrusions or projections extending from the base 106, including from the center portion 109 and from the edge portions 108a-108d. The fins are arranged in the dashed crosshatched fin pattern to guide airflow from all directions while exposing as much collective surface area of the fins as possible. In that regard, the fins includes the first fins 102 and the second fins 104 that form such dashed crosshatched fin pattern.

Each of the first fins 102 and the second fins 104 has a shape of a rectangular cuboid or a portion thereof. Each of the first fins 102 and the second fins 104 has a front surface, a back surface, two side surfaces, and a top surface. The top surface of each of the first fins 102 and the second fins 104 faces away from the base 106, for example, facing in a direction perpendicular to the base 106 (e.g., the Z-direction). In some examples, the top surfaces of the first fins 102 and the second fins 104 are coplanar, and the top surfaces of all of the first fins 102 and the second fins 104 are parallel to the center portion 109. As shown, in some examples, the first fins 102 and the second fins 104 extend to a same height relative to the center portion 109. Fin length is a length of each fin along or parallel to a direction perpendicular to the center portion 109 (e.g., the Z-direction). Given that some of the first fins 102 and the second fins 104 extend from the edge portions 108a-108d which are raised or sloped with respect to the center portion 109, the fin length of each of the first fins 102 and the second fins 104 that extends from at least a portion of the edge portions 108a-108d may vary. On the other hand, the fin length of each the first fins 102 and the second fins 104 that extends entirely from the center portion 109 is constant. In other examples (not shown), the first fins 102 and the second fins 104 extend to different heights relative to the center portion 109, and the top surfaces of all of the first fins 102 and the second fins 104 are not coplanar. An end of each of the first fins 102 and the second fins 104 is connected to the base 106 (e.g., to the center portion 109 and to the edge portions 108a-108d).

The front surface, the back surface, and the side surfaces of each of the first fins 102 and the second fins 104 are perpendicular to at least a portion (e.g., the center portion 109) of the base 106. As such, the first fins 102 and the second fins 104 appear to extend in a direction normal or perpendicular to the center portion 109. An area of the front surface or an area of the back surface is larger than an area of each of the two side surfaces for each fin. As such, the first fins 102 and the second fins 104 each appears to be a thin "fin" or rectangular plate. In some examples, the front surface and the back surface of each of the first fins 102 and the second fins 104 are flat (no curvature). In that regard, each of the first fins 102 and the second fins 104 is a straight fin that has no curvature, thus having an improved heat dissipation rate as compared to the heat dissipation rate of traditional posts/pins having curved surfaces. In other examples, the front surface and/or the back surface of each of the first fins 102 and the second fins 104 is curved or jagged.

As shown, the first fins 102 and the second fins 104 are separate and spaced apart from each other. In some examples, the fins 102 and 104 are equidistant. For example, a distance between two adjacent, parallel ones of the first fins 102 is the same as a distance between two other adjacent, parallel ones of the first fins 102. A distance between two adjacent, aligned ones of the first fins 102 is the same as a distance between two other adjacent, aligned ones of the first fins 102. A distance between two adjacent, parallel ones of the second fins 104 is the same as a distance between two other adjacent, parallel ones of the second fins 104. A distance between two adjacent, aligned ones of the second fins 104 is the same as a distance between two other adjacent, aligned ones of the second fins 104. As the first fins 102 and the second fins 104 are separate and spaced apart from each other, spaces or gaps are formed between the first fins 102 and the second fins 104. Such spaces and gaps form air channels through which air can flow. In particular, air from any direction toward the heat sink 100 is directed to flow through such air channels by the first fins 102 and the second fins 104 in the manner described.

In some examples, a direction or orientation of each of the first fins 102 and the second fins 104 corresponds to a direction in which the front surface and the back surface of each of the first fins 102 and the second fins 104 extends or an orientation of the front surface and the back surface of each of the first fins 102 and the second fins 104. Given that the front surface and the back surface of each of the first fins 102 and the second fins 104 have the largest surface area, heat dissipation primarily occurs on the front surface and the back surface through convection, which the areas of the side surfaces are kept small to make each of the first fins 102 and the second fins 104 thin in order to provide a path for airflow. In some examples, a direction or orientation of each of the first fins 102 and the second fins 104 corresponds to a direction or orientation of each of the first fins 102 and the second fins 104 as viewed from a direction normal to a surface of the center portion 109, for instance, as shown in FIG. 2.

In some examples, a reference line is defined relative to the base 106. The reference line can be any line that traverses through any portion of the base 106. In some examples, the reference line is parallel to or on a surface (e.g., the surface of the center portion 109) of the base 106. In some examples in which the base 106 has a generally rectangular shape (when viewed from a direction normal to a surface of the center portion 109 as shown in FIG. 2), the reference line is parallel to two opposing sides of the rectangular shape (e.g., two external edges of the edge portions 108c and 108d as shown in FIG. 2) and perpendicular to two other opposing sides (e.g., two external edges of the edge portions 108a and 108b as shown in FIG. 2) of the rectangular shape. In some examples in which the base 106 has a generally rectangular shape (when viewed from a direction normal to a surface of the center portion 109 as shown in FIG. 2), the reference line can be on any edge or side (e.g., an external edge of any of the edge portions 108a-108d as shown in FIG. 2) of the rectangular shape.

As shown in the FIGS. (especially in FIG. 2), each of the first fins 102 is at an X° angle relative to the reference line. That is, a direction in which the front surface and the back surface of each of the first fins 102 extends is at an X° angle relative to the reference line (e.g., an external edge of the edge portion 108d). On the other hand, each of the second fins 104 is at a −X° angle relative to the reference line. That is, a direction in which the front surface and the back surface of each of the second fins 104 extends is at a −X° angle relative to the reference line (e.g., the external edge of the edge portion 108d).

In the example shown in the FIGS., X is 45. In this case, each of the first fins 102 is perpendicular to any of the second fins 104, vice versa. That is, the front surface and the back surface of each of the first fins 102 is perpendicular to (e.g., at a 90° angle relative to) the front surface and the back surface of each of the second fins 104. In other examples (not shown), X can be suitable number such as but not limited to, 30, 50, 60, and so on.

Fin spacing/separation and the different orientations of the first fins 102 and the second fins 104 form the dashed crosshatch fin pattern. As described, each of the first fins 102 is separate from any of the second fins 104, vice versa. Each of the first fins 102 is separate from any other ones of the first fins 102, and each of the second fins 104 is separate from any other ones of the second fins 104. There are spaces or gaps among the first fins 102 and the second fins 104 through which air can flow. Given the angles of the first fins 102 and the second fins 104 as described herein, the fins of the heat sink 100 form the dashed crosshatched fin pattern.

Specifically, the term "dashed" refers to the fins that are aligned being separate from each other. Two fins are aligned if the fins appears to be on a same line (when viewed from the direction normal to the surface of the center portion 109 as shown in FIG. 2), if the front surfaces of the fins are on a same plane, or if the back surfaces of the fins are on a same plane. One of the first fins 102 can align with one or more other ones of the first fins 102 and not any of the second fins 104. One of the second fins 104 can align with one or more other ones of the second fins 104 and not any of the first fins 102.

As shown in FIGS. 1 and 2 in which X is 45, a group of the first fins 102 that are aligned can form a first dashed line (e.g., distributed along a first line). In some examples, the group of the first fins 102 are distributed evenly (adjacent ones of the group of the first fins 102 are spaced apart by the same distance) along the first line. Another group of the first fins 102 that are aligned can form a second dashed line (e.g., distributed along a second line). In some examples, the another group of the first fins 102 are also distributed evenly along the second line. The first dashed line (the first line) and the second dashed line (the second line) are parallel. FIGS. 1 and 2 further show a group of the second fins 104 form a third dashed line (e.g., distributed along a third line). In some examples, the group of the second fins 104 are also distributed evenly along the third line. Another group of the second fins 104 form a fourth dashed line (e.g., distributed along a fourth line). The third dashed line (the third line) and the fourth dashed line (the fourth line) are parallel. Furthermore, as shown, the first and second dashed lines are perpendicular to each of the third and fourth dashed lines. The first and second lines are perpendicular to each of the third and fourth lines. In some examples, a line along which some of the first fins 102 are distributed intersects with two or more of the second fins 104. In some examples, a line along which some of the second fins 104 are distributed intersects with two or more of the first fins 102. As shown, one of the second fins 104 is between two adjacent ones of the first fins 102. One of the first fins 102 is between two adjacent ones of the second fins 104. For example, at least one of the front surface or the back surface of each of the first fins 102 faces one of the side surfaces of one of the second fins 104. At least one of the front surface or the back surface of each of the second fins 104 faces one of the side surfaces of one of the first fins 102.

In some examples, the orientations (e.g., the dashed crosshatch fin pattern) of the first fins 102 and the second fins 104 extending from the edge portions 108a-108d, especially those of the first fins 102 and the second fins 104 that are on the external edges of the edge portions 108a-108d, allow air from any direction (e.g., airflow directions 101a-101d as well as other directions not shown) with respect to the heat sink 100 to flow toward the first fins 102 and the second fins 104 that extend from the center portion 109. For instance, by providing openings along the external edges of the edge portions 108c and 108d using some of the first fins 102 and the second fins 104 and providing openings along the external edges of the edge portions 108a and 108b using some others of the first fins 102 and the second fins 104, airflow from any direction (e.g., airflow directions 101a-101d as well as other directions not shown) with respect to the heat sink can be redirected toward the center portion 109 without being obstructed.

On the other hand, fins of traditional heat sinks that are at a 90° (instead of 45°) angle to an external edge of a rectangular heat sink may allow air to flow into a center portion of the heat sink in a first direction but significantly obstruct air to flow into the center portion in a second direction. To reduce obstruction, the pin/post design having a lower heat dissipation rate is traditionally used. The presently disclosed features allow air to flow into the heat sink from any direction while providing a maximum amount of surface area (e.g., the front and back surfaces of each of the first fins 102 and the second fins 104) to a faster heat dissipation rate.

As shown in FIG. 2, air (e.g., the air from the airflow direction 101d) can flow through the air channels formed by the front and back surfaces of the first fins 102 and the second fins 104 in zigzag paths. The air flows in the zigzag paths across the front and back surfaces of the first fins 102 and the second fins 104 to dissipate heat by convection. As shown in FIG. 2, air flowing to a front or back surface of one of the second fins 104 is redirected to a front or back surface of one or more adjacent ones of the first fins 102 and the second fins 104, and so on.

In some examples, the edge portions 108a-108d are peripheral flanges of the base 106 that slopes upward to form vents. For example, the edge portion 108a is a front portion that forms a front vent 120a. The edge portion 108b is a back portion that forms a back vent 120b. The edge portions 108c and 108d are side portions that form side vents 120c and 120d, respectively. In some implementations, air carrying heat from electronic components (e.g., a chip) coupled to the heat sink 100 can flow out from an enclosure formed by the heat sink 100 through the vents 120a-120d. In some examples, such air can flow into the fins 102 and 104 of the heat sink 100. In some examples, the vents 120a-120d are vents through which the air in the airflow directions 101a-101d (as well as other airflow direction not shown) flows into the electronic components (to flow into the enclosure formed by the heat sink), directly toward electronic components for direct dissipation through convection. As such, the heat sink 100 allows the electronic components to be dissipated indirectly through the fins 102 and 104 as well as directly through convection.

The electronic components can be coupled to a back side of the base 106 via suitable thermal insulation materials (TIMs). The back side of the base 106 (shown in FIG. 3) is opposite to a side of the base 106 from which the fins 102 and 104 extend. In one example, a silicon die or a chip is coupled or attached to a base plate which is attached to a TIM. The TIM is attached to the back side of the base 106 and transfers heat from the silicon die or chip to the base 106 via conduction. The heat is then transferred from the base to the fins 102 and 104 for dissipation.

Figure 6:
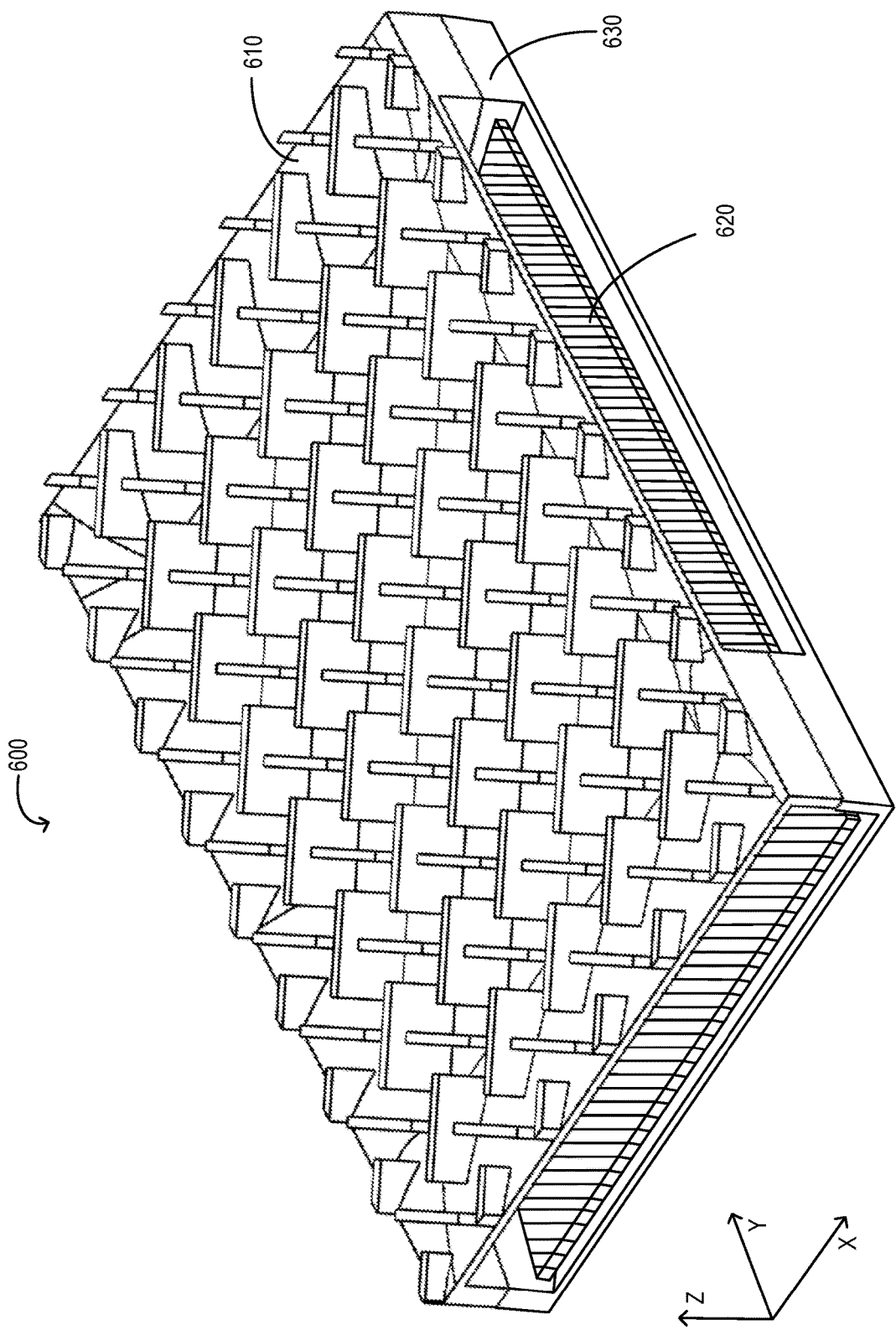
FIG. 6 is a perspective view of a heat sink configuration, according to some implementations.

FIG. 6 is a perspective view of a heat sink configuration, according to some implementations. Referring to FIGS. 1-6, the heat sink configuration corresponds to an enclosure 600 formed by a first heat sink 610 and a second heat sink 630.

Each of the first heat sink 610 and the second heat sink 630 is a heat sink such as but not limited to, the heat sink 100.

For example, the first heat sink 610 includes a first base (e.g., the base 106) having a first surface facing a first direction (e.g., the Z-direction). The first heat sink 610 includes a plurality of first heat sink fins (e.g., the fins 102 and 104) extending from the first surface in the first direction. Each of the first heat sink fins is spaced apart from other ones of the first heat sink fins. The first heat sink fins form a first dashed crosshatch pattern in the manner described.

The second heat sink 630 includes a second base (e.g., the base 106) having a second surface facing a second direction (e.g., the −Z-direction). The first direction is opposite to the second direction. The second heat sink 630 includes a plurality of second heat sink fins (e.g., the fins 102 and 104) extending from the second surface in the second direction. Each of the second heat sink fins is spaced apart from other ones of the second heat sink fins. The second heat sink fins form a second dashed crosshatch pattern in the manner described.

An electronic component (e.g., a chip 620) is enclosed by the first and second heat sinks 620 and 630. The chip 620 is coupled to the back sides of the first and second bases of the heat sinks 610 and 630 via suitable TIMs. The TIMs are attached to the back side of the first and second bases and transfer heat from the chip 620 to the first and second bases via conduction. The heat is then transferred from the first and second bases to the fins of the heat sinks 610 and 630 for dissipation.

In addition, the enclosure formed by the heat sinks 610 and 630 can form vents similar to vents 120a-120d that allow venting of air carrying heat generated by the chip 620 as well as to allow air from the airflow direction 101a-101d (as well as other airflow directions not shown) to flow into the enclosure to directly dissipate heat from those electronics on the chip 620 by convection when the chip 620 is enclosed by the enclosure.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A heat sink, comprising:
 a base having a reference line;
 a plurality of fins extending from the base, each of the fins having a length and a width, the plurality of fins comprising first fins and second fins,
 wherein the first fins include a first alternating pattern of a plurality of the first fins and a plurality of first spaces between the plurality of the first fins, all of the first fins in the first alternating pattern having their lengths arranged along a first line, and wherein the second fins include a second alternating pattern of a plurality of the second fins and a plurality of second spaces between the plurality of second fins, all of the second fins in the second alternating pattern having their lengths arranged along a second line, and wherein one of the first fins occupies and extends from the base in each of the plurality of second spaces and one of the second fins occupies and extends from the base in each of the plurality of first spaces, and wherein each of the first fins is at an X° angle relative to the reference line, and each of the second fins is at a −X° angle relative to the reference line.

2. The heatsink of claim 1, wherein the plurality of fins extend in a perpendicular direction from the base.

3. The heat sink of claim 1, wherein
air channels between the plurality of fins are formed as a result of each of the plurality of fins being spaced apart from other ones of the plurality of fins;
air from any direction toward the heat sink is directed to flow through the air channels by the plurality of fins.

4. The heat sink of claim 3, wherein the air is directed to flow through the air channels in zigzag paths.

5. The heat sink of claim 3, wherein
a first group of the first fins is distributed along a first line;
a second group of the first fins is distributed along a second line; and
the first line and the second line are parallel.

6. The heat sink of claim 3, wherein
a first group of the second fins is distributed along a first line;
a second group of the second fins is distributed along a second line; and
the first line and the second line are parallel.

7. The heat sink of claim 3, wherein
a group of the first fins is distributed along a first line;
a group of the second fins is distributed along a second line; and
the first line and the second line are perpendicular.

8. The heat sink of claim 7, wherein
the first line intersects with two or more of the second fins; and
the second line intersects with two or more of the first fins.

9. The heat sink of claim 1, wherein
each of the plurality of fins comprises a front surface, a back surface, and two side surfaces;
the front surface, the back surface, and the side surfaces are perpendicular to at least a portion of the base; and
an area of the front surface or an area of the back surface is larger than an area of each of the two side surfaces.

10. The heat sink of claim 9, wherein the front surface and the back surface are flat.

11. The heat sink of claim 9, wherein at least one of the front surface or the back surface of each of the first fins is perpendicular to at least one of the front surface or the back surface of each of the second fins.

12. The heat sink of claim 9, wherein at least one of the front surface or the back surface of each of the first fins faces one of the side surfaces of one of the second fins.

13. The heat sink of claim 1, wherein X° is 45°.

14. The heat sink of claim 1, wherein each of the first fins is perpendicular to any of the second fins.

15. The heat sink of claim 1, wherein the reference line is parallel to or on a surface of the base.

16. The heat sink of claim 1, wherein
the base has a rectangular shape; and
the reference line is parallel to or on a side of the heat sink.

17. The heat sink of claim 1, further comprising
a front portion forming a front vent;
a back portion forming a back vent;
two side portions each forming a side vent; and
a raised surface parallel to at least a portion of the base, the raised surface forming one or more cavities.

18. The heat sink of claim 1, wherein
one of the second fins is between two adjacent ones of the first fins; and
one of the first fins is between two adjacent ones of the second fins.

19. A heat sink, comprising:
a base;
a plurality of fins extending from the base, each of the plurality of fins being spaced apart from other ones of the plurality of fins and having a length and a width, the plurality of fins comprising first fins and second fins, each of the first fins is perpendicular to any of the second fins,
wherein the first fins include a first alternating pattern of a plurality of the first fins and a plurality of first spaces between the plurality of the first fins, all of the first fins in the first alternating pattern having their lengths arranged along a first line, and
wherein the second fins include a second alternating pattern of a plurality of the second fins and a plurality of second spaces between the plurality of second fins, all of the second fins in the second alternating pattern having their lengths arranged along a second line, and
wherein one of the first fins occupies and extends from the base in each of the plurality of second spaces and one of the second fins extend occupies and extends from the base in each of the plurality of first spaces.

20. A heat sink configuration, comprising:
a first heat sink, comprising:
a first base having a first surface facing a first direction;
a plurality of first heat sink fins extending from the first surface in the first direction, each of the plurality of first heat sink fins being spaced apart from other ones of the plurality of first heat sink fins and having a length and a width, the plurality of first heat sink fins forming a first dashed crosshatch pattern,
wherein the first heat sink fins include a first alternating pattern of a plurality of first oriented fins and a plurality of first spaces between the plurality of the first oriented fins, all of the first oriented fins in the first alternating pattern having their lengths arranged along a first line, and
wherein the first heat sink fins include a second alternating pattern of a plurality of second oriented fins and a plurality of second spaces between the plurality of second oriented fins, all of the second fins in the second alternating pattern having their lengths arranged along a second line, and
wherein one of the first oriented fins occupies and extends from the base in each of the plurality of second spaces and one of the second oriented fins occupies and extends from the base in each of the plurality of first spaces; and
a second heat sink, comprising:
a second base having a second surface facing a second direction, the first direction being opposite to the second direction;

a plurality of second heat sink fins extending from the second surface in the second direction, each of the plurality of second heat sink fins being spaced apart from other ones of the plurality of second heat sink fins, the plurality of second heat sink fins forming a second dashed crosshatch pattern.

\* \* \* \* \*